United States Patent
Chu et al.

(10) Patent No.: US 10,510,742 B1
(45) Date of Patent: Dec. 17, 2019

(54) INTEGRATED CIRCUIT STRUCTURE

(71) Applicant: TAIWAN SEMICONDUCTOR MANUFACTURING COMPANY LTD., Hsinchu (TW)

(72) Inventors: Yu-Lin Chu, Hsinchu (TW); Hsi-Yu Kuo, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/103,552

(22) Filed: Aug. 14, 2018

(51) Int. Cl.
*H01L 27/02* (2006.01)
*H01L 23/535* (2006.01)
*H01L 29/10* (2006.01)
*H01L 27/06* (2006.01)

(52) U.S. Cl.
CPC ........ *H01L 27/0255* (2013.01); *H01L 23/535* (2013.01); *H01L 27/0629* (2013.01); *H01L 29/1079* (2013.01)

(58) Field of Classification Search
CPC ............. H01L 27/0255; H01L 29/1079; H01L 23/535; H01L 27/0629
See application file for complete search history.

(56) References Cited

U.S. PATENT DOCUMENTS

| 5,796,147 A * | 8/1998 | Ono ..................... H01L 27/0218 257/355 |
| 2007/0159744 A1* | 7/2007 | Dutta ...................... H01L 23/60 361/56 |
| 2016/0268251 A1* | 9/2016 | Hwang ............. H01L 29/42368 |

* cited by examiner

*Primary Examiner* — Yasser A Abdelaziez
(74) *Attorney, Agent, or Firm* — WPAT, P.C., Intellectual Property Attorneys; Anthony King

(57) ABSTRACT

An IC structure includes a substrate, a deep n-well (DNW), a first device, a second device, a first electrical path and a second electrical path. The DNW is in the substrate. The first device is formed inside the DNW and connected to a first lower reference voltage and a first higher reference voltage. The second device is formed in the substrate and outside the DNW, and connected to a second lower reference voltage and a second higher reference voltage. The first electrical path is electrically connected between the first device and the second device. The second electrical path is electrically connected between the first lower reference voltage and the second lower reference voltage. A second metal layer that includes the second electrical path is located in an area outside of an area above a first metal layer in which the first electrical path is located.

20 Claims, 9 Drawing Sheets

INTEGRATED CIRCUIT STRUCTURE

BACKGROUND

Integrated circuits (ICs) are increasingly important due to their widespread application in today's electronic consumer products, such as smart phones, tablets, laptops, notebook computers, and the like. Integrated circuits increasingly include powerful and efficient data storage and logic circuitry for signal control and processing.

Increasing density of devices in integrated circuits, as well as increasing combinations of various types of circuitry, such as logic and radio frequency processing circuits, have generally increased the amount of noise in various circuits. Noise can be detrimental in integrated circuits, because compromised signal integrity can cause a loss of data or errors in logic or signal processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
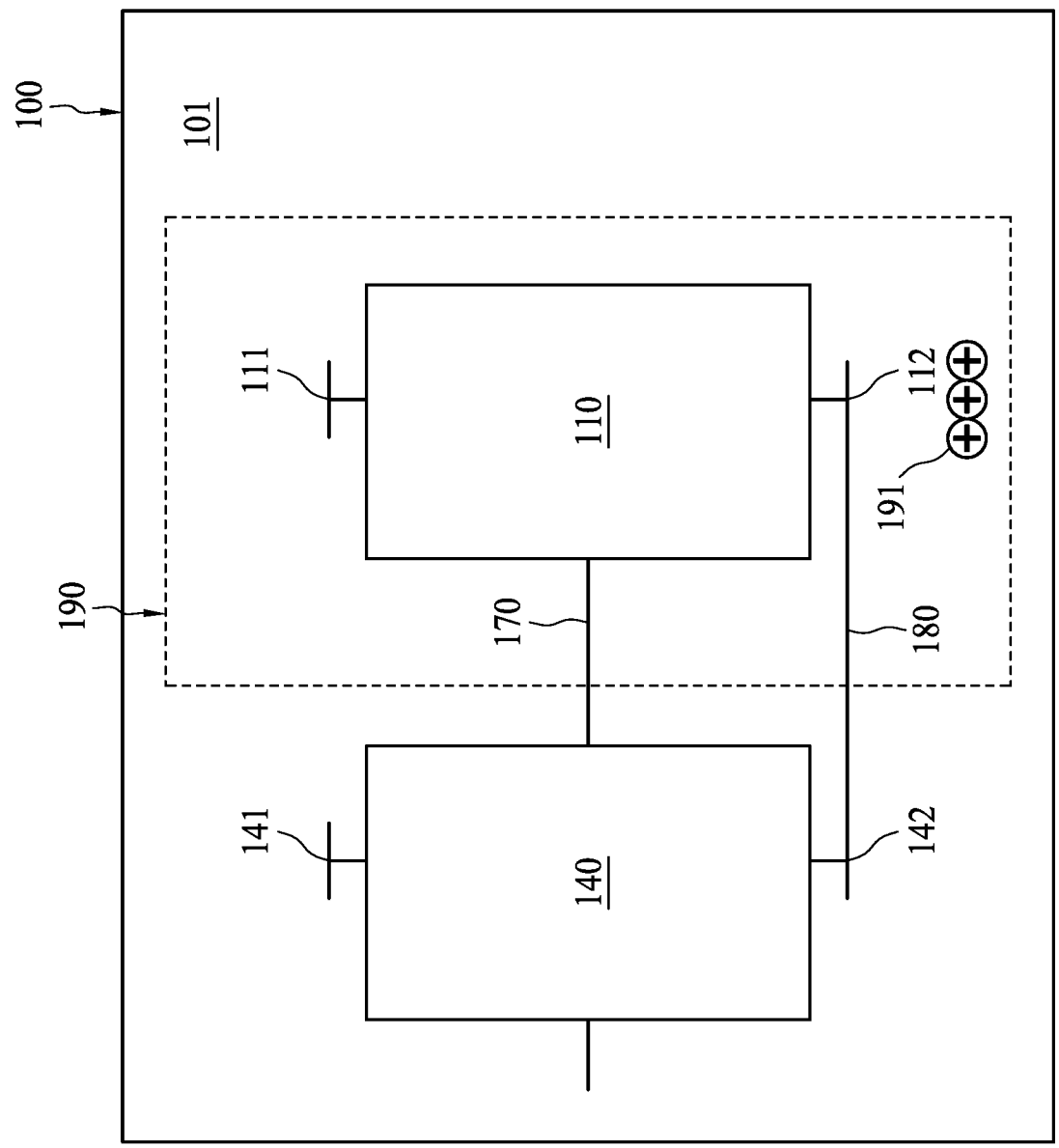
FIG. 1 is a circuit diagram of an IC structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Embodiments are generally described in the context of an integrated circuit. Embodiments may be applied to any integrated circuit, for example, a logic circuit, a static random access memory (SRAM), and the like.

FIG. 1 is a circuit diagram of an IC structure 100, in accordance with some embodiments. Referring to FIG. 1, the IC structure 100 include a substrate 101, a deep n-well (DNW) 190, a first device 110 and a second device 140. The DNW 190 is formed in the substrate 101. The first device 110 is formed inside the DNW 190 and is connected to a first higher reference voltage 111 and a first lower reference voltage 112. The second device 140 is formed in the substrate 101 and outside the DNW 190, and is connected to a second higher reference voltage 141 and a second lower reference voltage 142. The second higher reference voltage 141 is independent from the first higher reference voltage 111. The second lower reference voltage 142 is independent from the first lower reference voltage 112. In some embodiments, the first higher reference voltage 111 and the second higher reference voltage 141 are connected to different power sources. In some embodiments, the first lower reference voltage 112 and the second lower reference voltage 142 are connected to different grounds. A first electrical path 170 is electrically connected between the first device 110 and the second device 140. A second electrical path 180 is electrically connected between the first lower reference voltage 112 and the second lower reference voltage 142.

As mentioned in the background, noise can be detrimental in integrated circuits because signal integrity can be compromised. Devices in an integrated circuit are formed in a deep doped well, such as the DNW 190 described above, to isolate substrate noise. Deep doped wells refer to doped wells that are located lower (or deeper into the substrate 101) than the doped wells surrounding transistors and/or other devices. The deep doped well (e.g., the DNW 190) is typically able to reduce noise between other devices in the substrate 101 and devices in the deep doped well by providing a low resistance path that allows the noise to travel to a ground node rather than affecting devices in the deep doped well. For example, devices for high speed applications, having mixed signals, or having radio frequency (RF) circuits are susceptible to noise interference. Therefore, such devices may employ the deep doped well (e.g., the DNW 190) for noise reduction.

During device manufacturing, various plasma operations may be used in fabricating devices and interconnects for connecting these devices. Plasma operations used in manufacturing devices may include, but are not limited to, reactive ion etch (RIE) used for removing materials on a semiconductor substrate, plasma-enhanced deposition for forming films, ion implantation for forming doped regions, and physical vapor deposition (PVD) for depositing conductive materials. For example, a high density plasma (HDP) deposition may be used to deposit an inter-level dielectric (ILD) layer, or an inter-metal dielectric (IMD) layer. A physical vapor deposition (PVD) operation uses plasma discharge to sputter conductive materials off targets for depositing them onto substrates to form contacts and vias in the ILD layers. Plasma ions may directly contact a substrate surface and be implanted into the substrate. In addition, plasma ions may be transferred to a substrate indirectly. For example, plasma may be used to assist etching, such as in the case of reactive ion etch (RIE), to form openings or patterns in or on substrates. The openings generally extend to some underlying conductive feature, and the plasma used for the plasma operation is able to contact the conductive feature and be transported into the substrate. In structures having devices that include doped wells, charges from the plasma can be transferred through the conductive feature to the doped wells.

As mentioned above, many manufacturing operations involve plasma. If the substrate 101 is not grounded properly, ions in the plasma can accumulate in various layers in and/or on the substrate 101. For example, during RIE, the substrate 101 is biased to attract positive etching ions to increase ion energy and etch rate. Improper substrate grounding accumulates positive ions in or on the substrate 101, such as positive ions 191 in the DNW 190. The DNW 190 is a relatively large region in comparison to the regions of the first device 110 and second device 140. As a result, charges accumulated in the DNW 190 may be fairly significant. The charges collected in the DNW 190 may be a result of one or more plasma processing operations, such as etching, film deposition, and ion implanting.

When the first electrical path 170 (an interconnect) is formed between the first device 110 and second device 140, the positive ions 191 may flow from the first device 110 to the second device 140 due to a voltage drop and may damage the structure of the first device 110. Damaged structure may result in inconsistent and uncontrollable performance of the first device 110. Therefore, the charges in the DNW 190 may degrade a yield of the first device 110.

Plasma damage caused by the accumulated positive ions 191 in the DNW 190 is different from plasma damage involving an antenna (conductive structures connected to the damaged gate). Antenna plasma damage involves conductive layers connected to gate structures and is affected by a size of the antenna. Positive ions 191 flow from the gate dielectric through the conductive layer(s) and the conductive layer acts as the antenna to receive the positive ions 191. Antenna plasma damage mainly results from back-end processing, which involves back-end plasma operations, such as deposition and etching of dielectric and metal layers.

An antenna design rule can be used to make sure a circuit design does not violate the antenna ratio. However, plasma damage by positive ions 191 in the DNW 190 is different from antenna plasma damage. Positive ions 191 in the DNW 190 come from exposure of the DNW 190 region to plasma sources during manufacturing. The plasma sources can come from front-end plasma operation(s) and back-end plasma operation(s). Studies show that antenna design rules may not resolve plasma damage caused by positive ions 191 in the DNW 190. Devices, such as the first device 110, can pass the antenna design rule but still suffer from damage caused by positive ions 191 from the DNW 190. Antenna design rules are used to evaluate prospective ratios of metal layers to gate structures (also known as antenna ratios) and to check for plasma damage caused by back-end processing. Antenna design rules do not account for sources of plasma damage, such as front-end processing, before forming the first metal layer.

In some embodiments, the first electrical path 170 may be formed on one single metal layer, such as M1, M2, or other metal layer, in accordance with some embodiments. It is noted that M1 denotes the first metal layer and M2 denotes the second metal layer in the IC structure 100. Alternatively, the first electrical path 170 may be formed on more than one metal layer having vias connecting the metal layers. For example, the first electrical path 170 may involve metal layers M1, M2, and M3 and may include vias connecting M1 to M2 and M2 to M3. The positive ions (plasma charge) 191 in the DNW 190 flow from the first device 110 toward the second device 140 if the final metal layer of the first electrical path 170, such as the M2 layer in the previous example, is deposited. As mentioned above, the first device 110 may be damaged by the positive ions 191.

Referring to FIG. 1, the IC structure 100 may have the second electrical path 180 formed at a same metal layer as the first electrical path 170, or formed at a metal layer lower than the first electrical path 170. In an exemplary embodiment, the metal layer for the first electrical path 170 and the second electrical path 180 is mainly for signal transmission and is not for power transmission. The metal layer for signal transmission is generally lower than the metal layer for power transmission. In some embodiments, the lower metal layers for signal transmission include M1 to M3 metal layers.

Briefly, during the fabrication of the IC structure 100, the second electrical path 180 may be formed at the same time as the first electrical path 170 (i.e. the second electrical path 180 and the first electrical path 170 are formed at the same metal layer), or the second electrical path 180 may be formed before the first electrical path 170 (i.e. the second electrical path 180 is formed at the metal layer lower than the first electrical path 170). Thus, the positive ions 191 around the lower reference voltage 112 in the DNW 190 may be discharged through the second electrical path 180 from the first lower reference voltage 112 to the second lower reference voltage 142 during the back-end plasma operations. Therefore, the positive ions 191 may not accumulate during the back-end plasma operations and the damage to the first device 110 may be alleviated.

Figure 2A:
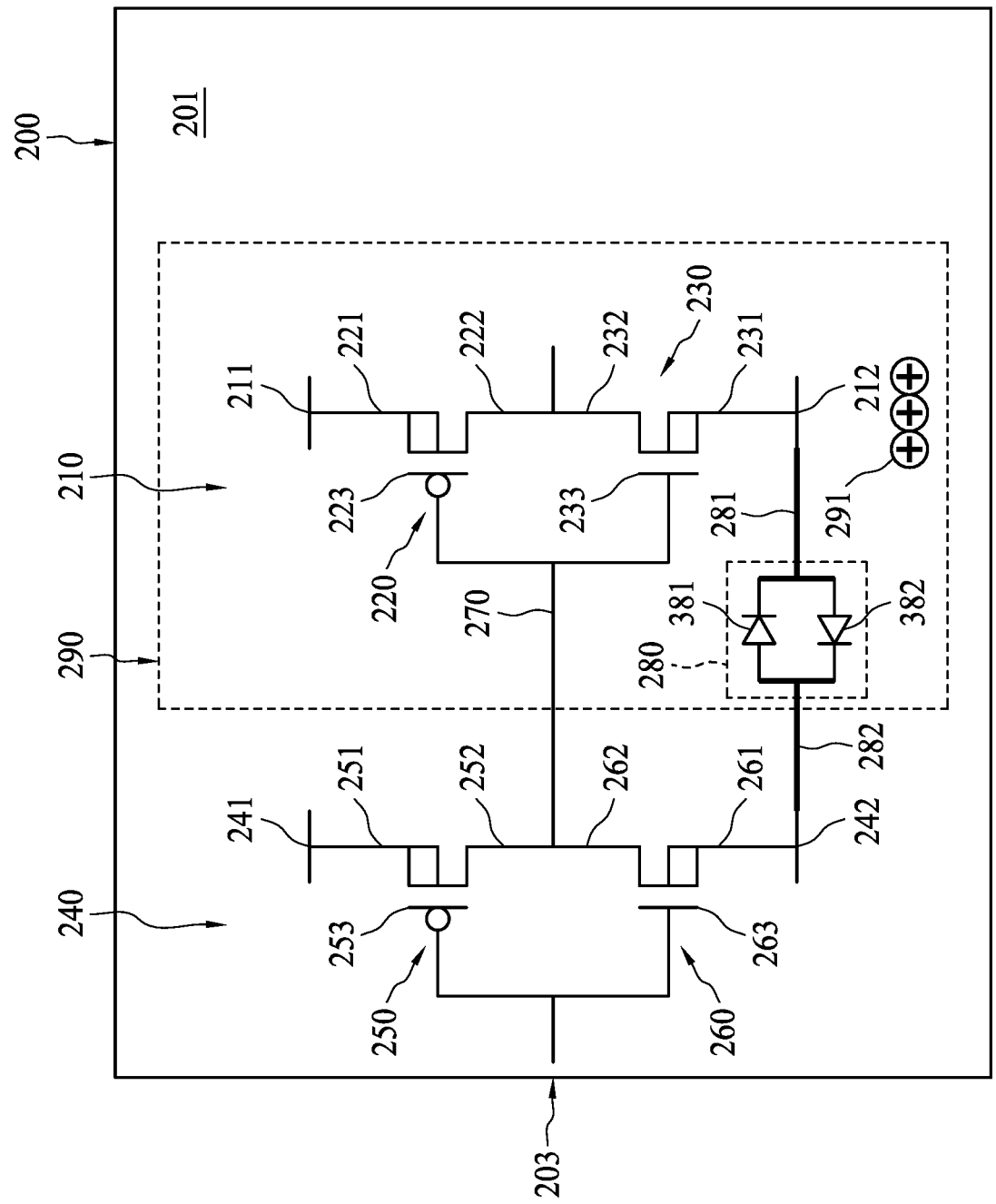
FIG. 2A is a circuit diagram of an IC structure, in accordance with some embodiments.
Figure 2B:
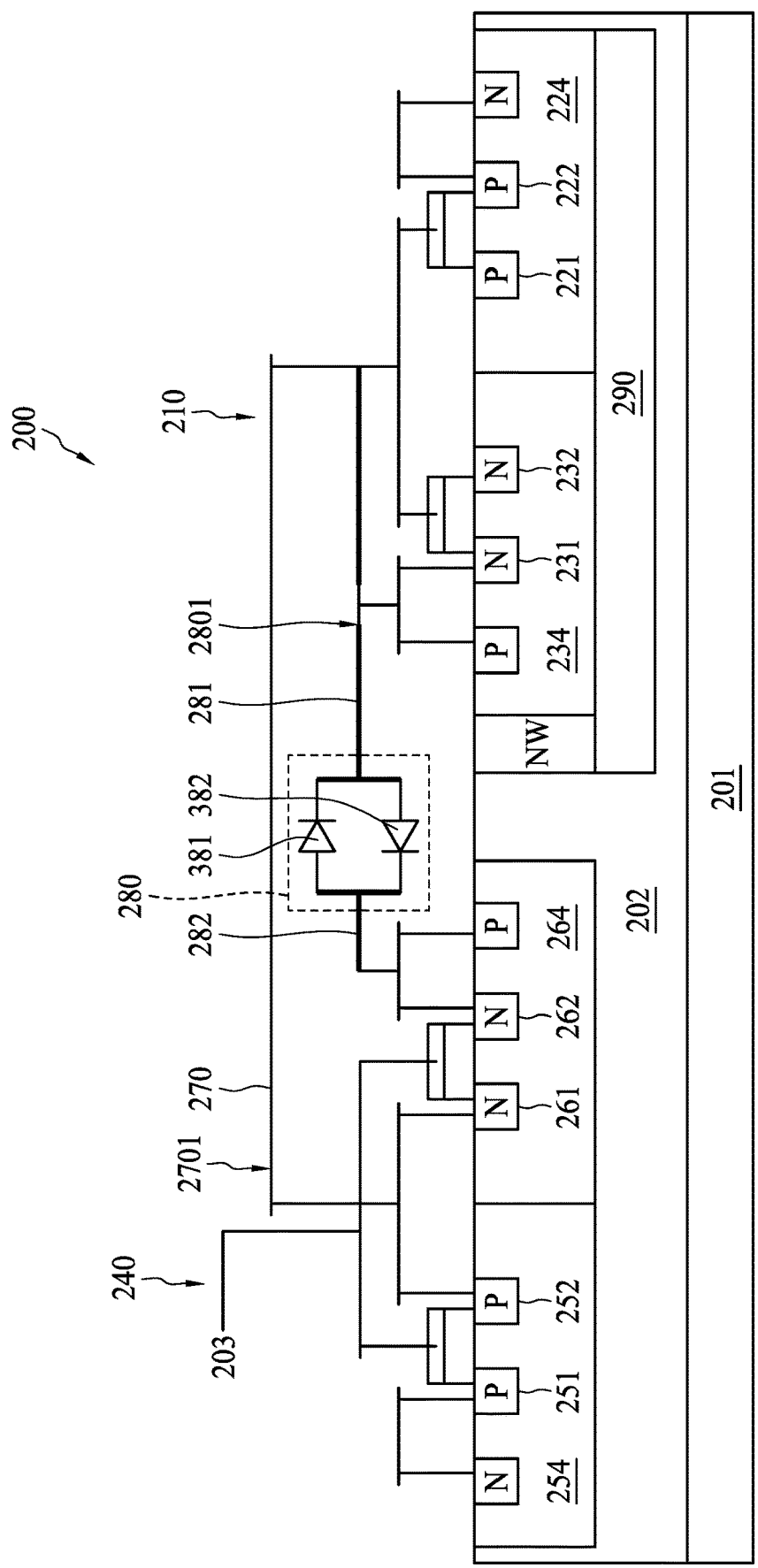
FIG. 2B is a cross-sectional view of a device portion of the IC structure, in accordance with some embodiments.

FIG. 2A is a circuit diagram of an IC structure 200, in accordance with some embodiments. FIG. 2B is a cross-sectional view of a device portion of the IC structure 200, in accordance with some embodiments. Referring to FIG. 2A and FIG. 2B, the first device 210 may be an inverter. The first device 210 may include a p-channel metal-oxide-semiconductor field-effect transistor (P-channel MOSFET or PMOS transistor) 220 and an N-channel MOSFET (or NMOS transistor) 230. The PMOS transistor 220 has a source 221, a drain 222, and a gate 223. The source 221 is connected to a higher reference voltage (e.g., VDD) 211 and the drain 222 is connected to a drain 232 of the NMOS transistor 230. The NMOS transistor 230 has a source 231, the drain 232, and a gate 233. The source 231 of the NMOS transistor 230 is connected to a lower reference voltage (e.g., ground) 212.

The first device 210 may be formed in and on a substrate 201 within a p-doped region 202. In some embodiments, additional layer(s) are formed between the p-doped region 202 and the substrate 201. The source 221 and drain 222, both of which are doped with p-type dopants, of the PMOS transistor 220 of the first device 210 are formed in an n-well (or NW) 224. The source 231 and drain 232 (both of which are doped with n-type dopants) of the NMOS 230 of the first device 210 are formed in a p-well (or PW) 234. Both the n-well 224 and the p-well 234 of the first device 210 are formed over a deep n-well (or DNW) 290.

The second device 240 may be an inverter. The second device 240 may include a PMOS transistor 250 and an NMOS transistor 260. The PMOS transistor 250 has a source 251, a drain 252, and a gate 253. The source 251 is connected to a higher reference voltage (e.g., VDD) 241 independent of the higher reference voltage 211, and the drain 252 is connected to a drain 262 of the NMOS transistor 260. The NMOS transistor 260 has a source 261, the drain 262, and a gate 263. The source 261 of the NMOS transistor 260 is connected to a lower reference voltage (e.g., ground) 242 independent of the lower reference voltage 212. The gate 253 of the PMOS transistor 250 and the gate 263 of the NMOS transistor 260 are connected to a signal source 203. The gate 223 of the PMOS transistor 220 and the gate 233 of the NMOS transistor 230 are connected to the drain 252 of the PMOS transistor 250 and the drain 262 of the NMOS transistor 260 via the electrical path 270.

The second device 240 may be formed in and on a substrate 201 within the p-doped region 202. The source 251 and drain 252, both of which are doped with p-type dopants, of the PMOS transistor 250 of the second device 240 are formed in an n-well (or NW) 254. The source 261 and drain 262, both of which are doped with n-type dopants, of the NMOS 260 of the second device 240 are formed in a p-well (or PW) 264.

In some embodiments, the IC structure 200 further includes a dissipation device 280 formed in the substrate 201. The dissipation device 280 is coupled between the lower reference voltage 212 and the lower reference voltage 242 through the electrical paths 281, 282. The dissipation device 280 is connected to the lower reference voltage 212 through the electrical path 281 and connected to the lower reference voltage 242 through the electrical path 282. In some embodiments, a metal layer 2801 that includes the electrical path 281, 282 is located in an area outside the area above a metal layer 2701 in which the electrical path 270 is located. The dissipation device 280 and the electrical paths 281, 282 may be at a same metal layer as the electrical path 270 or at a metal layer lower than the electrical path 270. In some embodiments, the metal layer 2701 is not above an M3 level. It is noted that the metal layers 2701 and 2801 in FIG. 2B are simplified for explanation and are not intended to be limiting.

In some embodiments, the dissipation device 280 may include an ESD protection circuit. The ESD protection circuit may be a back-to-back diodes clamp. The back-to-back diodes clamp may include diodes 381 and 382 connected inversely. These are, of course, merely examples and are not intended to be limiting. The diodes 381 and 382 are connected with the electrical paths 281 and 282.

As mentioned above, many manufacturing operations involve plasma. In such operations, positive ions 291 in the plasma may accumulate in various layers in and/or on the substrate 201. When the electrical path 270 (an interconnect) between the first device 210 and second device 240 is formed, the positive ions 291 may flow from the first device 210 to the second device 240 due to a voltage drop and may damage the gate 233 structure of the NMOS transistor 230. Damaged gate structure may result in inconsistent and uncontrollable performance of the first device 210.

During the fabrication of the IC structure 200, the dissipation device 280 and the electrical paths 281, 282 may be formed at the same time as the electrical path 270 (i.e., the dissipation device 280 and the electrical paths 281, 282 and 270 are formed at the same metal layer), or the dissipation device 280 and the electrical paths 281, 282 may be formed before the electrical path 270 (i.e. the dissipation device 280 and the electrical paths 281, 282 are formed at the metal layer lower than the electrical path 270). Thus, the positive ions 291 in the DNW 290 may be discharged through the dissipation device 280 and the electrical paths 281, 282 from the lower reference voltage 212 to the lower reference voltage 242 during the back-end plasma operations. Accumulation of the positive ions 291 during the back-end plasma operations may be prevented and the damage to the gate structure of the NMOS 230 may be alleviated. Furthermore, the back-to-back diodes clamp may generally be formed in the IC structure 200, and thus no additional device needs to be added and the size of the IC structure 200 may be maintained or decreased.

Figure 3:
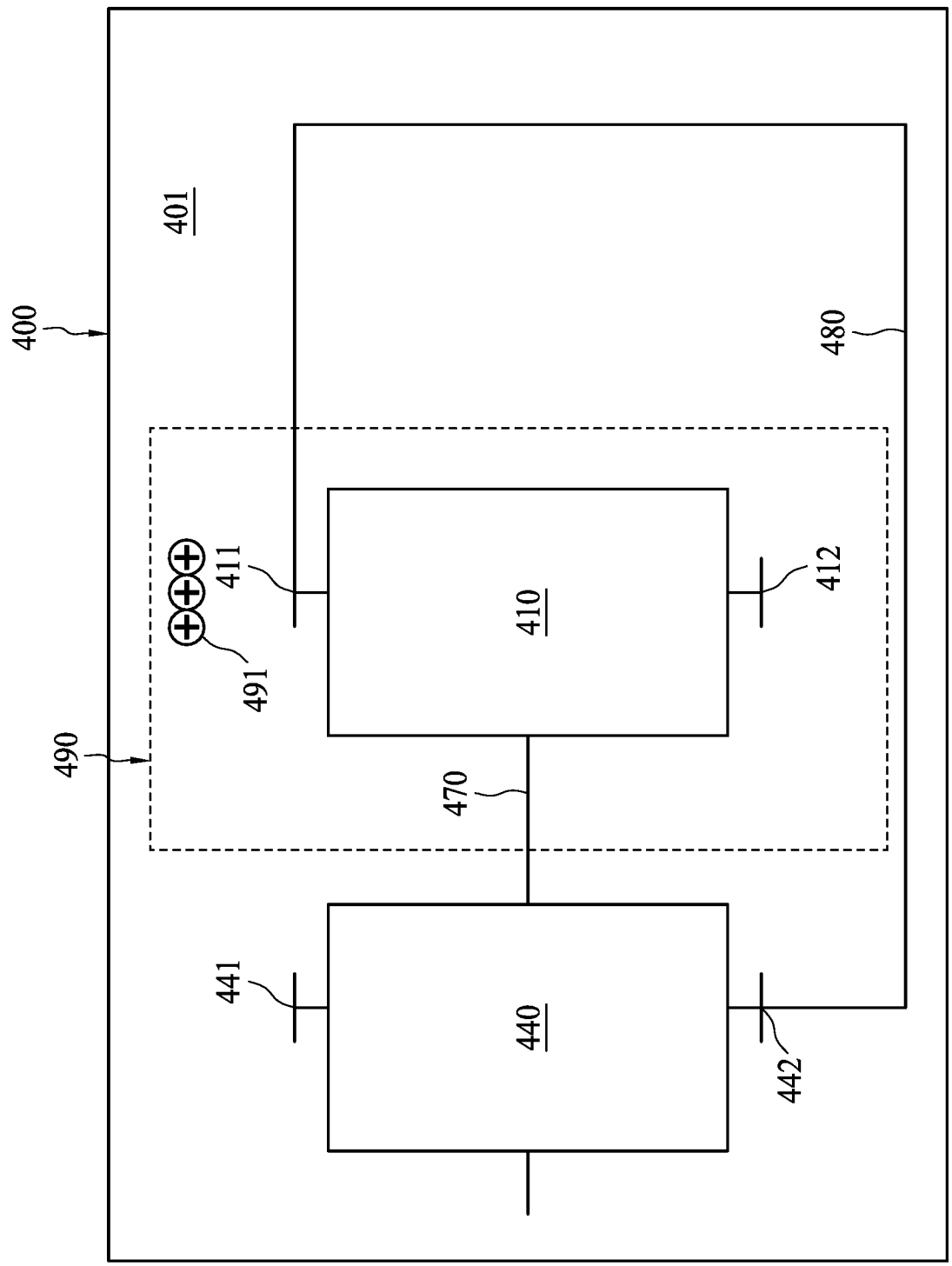
FIG. 3 is a circuit diagram of an IC structure, in accordance with some embodiments.

FIG. 3 is a circuit diagram of an IC structure 400, in accordance with some embodiments. The difference between the IC structure 400 and the IC structure 100 in FIG. 1 is that the IC structure 400 includes an electrical path 480 electrically connected between the higher reference voltage (e.g., VDD) 411 and the lower reference voltage (e.g., ground) 442. In some embodiments, the positive ions 491 may accumulate around the higher reference voltage 411 in the DNW 490. As with the embodiment shown in FIG. 1, the electrical path 480 may be formed at a same metal layer as the electrical path 470 or formed at a metal layer lower than electrical path 470, and the detailed description is omitted herein for brevity.

During fabrication of the IC structure 400, the positive ions 491 around the higher reference voltage 411 in the DNW 490 may be discharged through the electrical path 480 from the higher reference voltage 411 to the lower reference voltage 442 during the back-end plasma operations. Therefore, accumulation of the positive ions 491 during the back-end plasma operations may be prevented and the damage to the first device 410 may be alleviated.

Figure 4A:
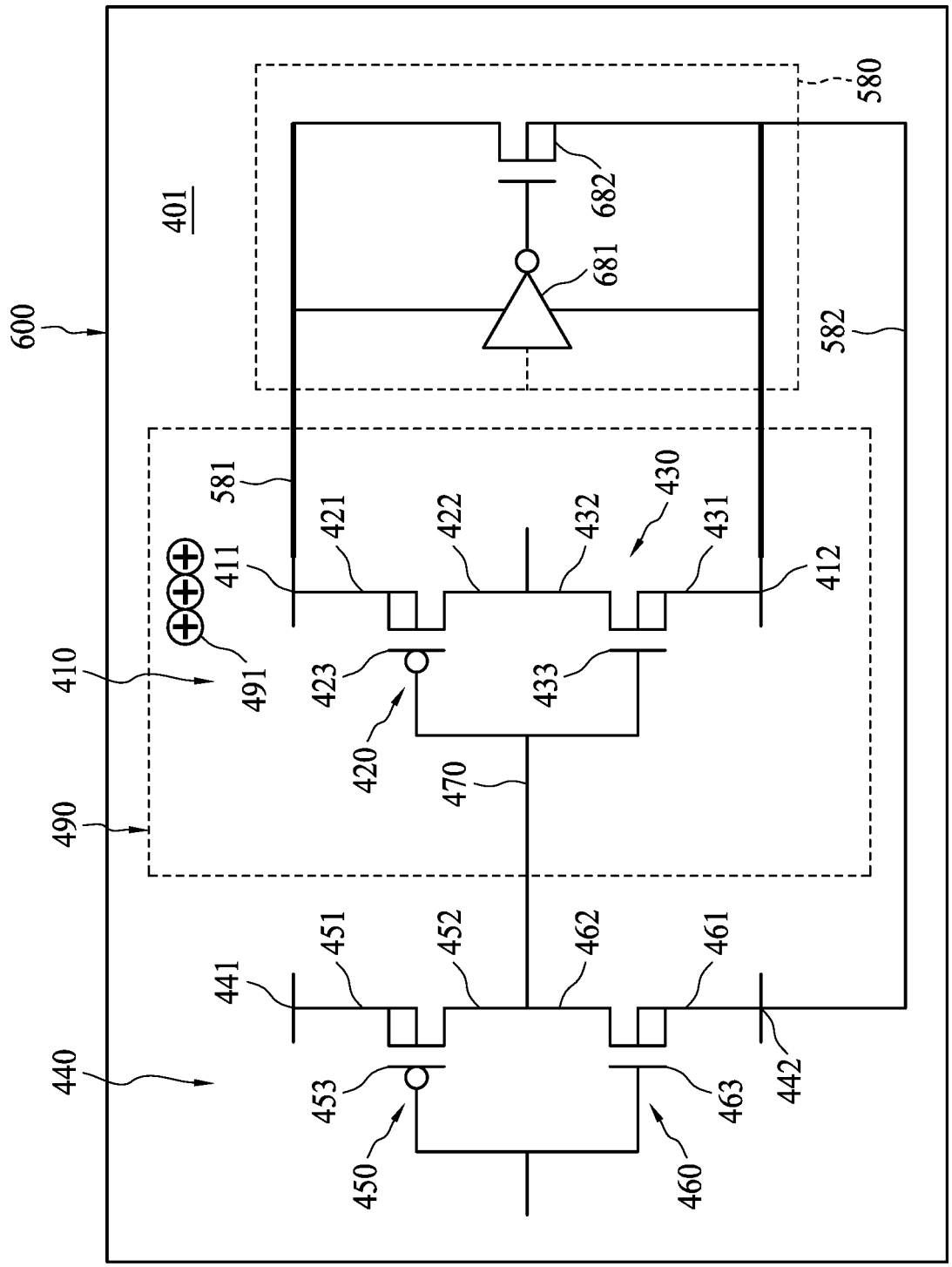
FIG. 4A is a circuit diagram of an IC structure, in accordance with some embodiments.
Figure 4B:
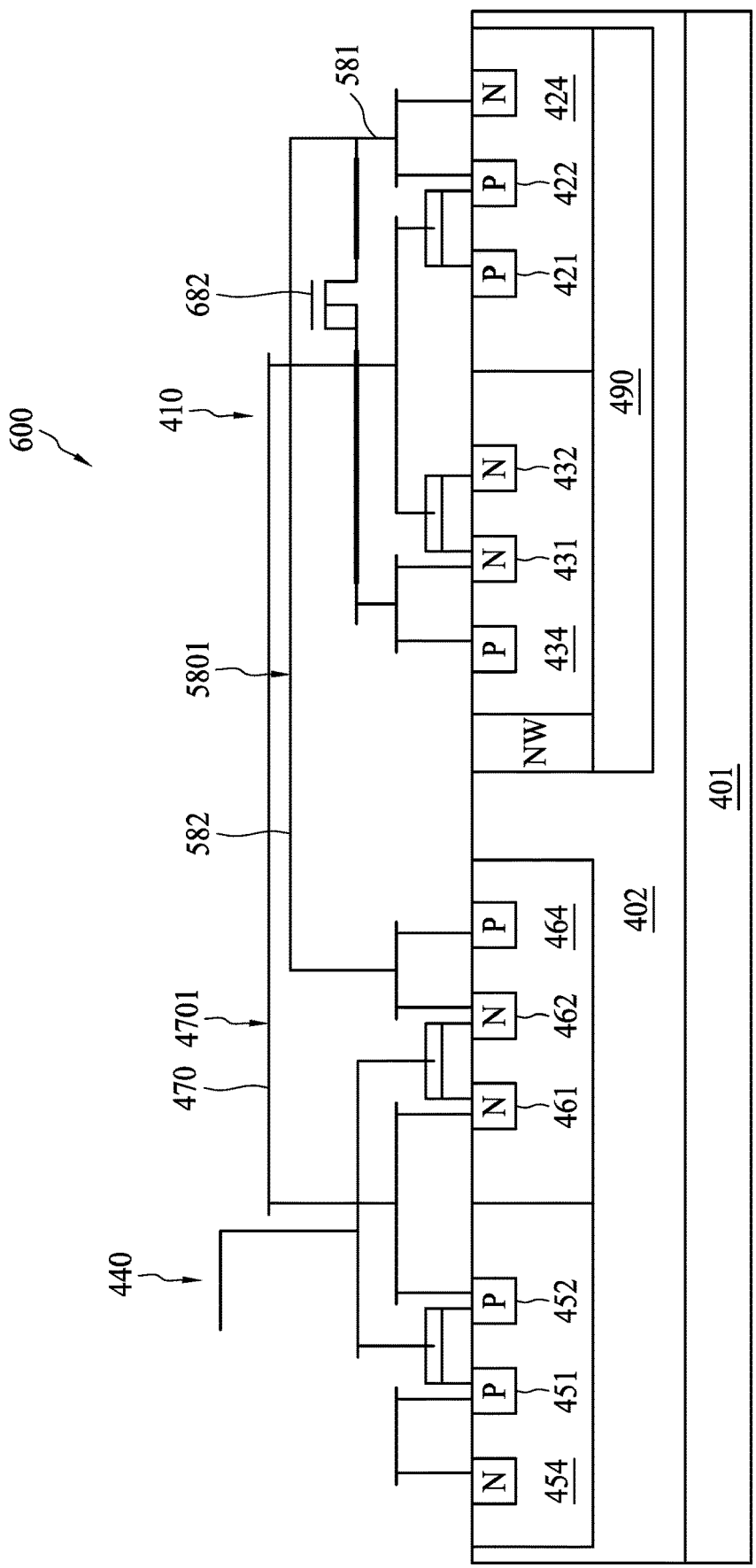
FIG. 4B is a cross-sectional view of a device portion of the IC structure, in accordance with some embodiments.

FIG. 4A is a circuit diagram of an IC structure 600, in accordance with some embodiments. FIG. 4B is a cross-sectional view of a device portion of the IC structure 600, in accordance with some embodiments. The difference between the IC structure 600 and the IC structure 400 in FIG. 3 is that the IC structure 600 includes a dissipation device 580 formed in the substrate 401. The dissipation device 580 is coupled between the higher reference voltage 411 and the lower reference voltage 442 through the electrical paths 581, 582. The dissipation device 580 is connected to the higher reference voltage 411 through the electrical path 581 and connected to the lower reference voltage 442 through the electrical path 582. In some embodiments, the dissipation device 580 and the electrical paths 581, 582 are at a same metal layer as the electrical path 570 or at a metal layer lower than the electrical path 570. Moreover, as in the embodiment shown in FIG. 2A and FIG. 2B, the first device 410 may include a PMOS transistor 420 and an NMOS transistor 430, and the second device 440 may include a PMOS transistor 450 and an NMOS transistor 460, and the detailed description is omitted herein for brevity.

In some embodiments, the dissipation device 580 may include an ESD protection circuit. The ESD protection circuit may be a power clamp circuit. The power clamp circuit may include an inverter 681 and an transistor 682 connected to the inverter 681. These are, of course, merely examples and are not intended to be limiting. The power clamp circuit is connected to the electrical paths 581 and 582.

In some embodiments, a metal layer 5801 that includes the electrical path 581, 582 is located in an area outside the area above a metal layer 5701 in which the electrical path 470 is located. The dissipation device 580 and the electrical paths 581, 582 may be at a same metal layer as the electrical path 470 or at a metal layer lower than the electrical path 470. In some embodiments, the metal layer 4701 is not above an M3 level. It is noted that the metal layers 4701 and 5801 in FIG. 4B are simplified for explanation and are not intended to be limiting.

Briefly, during the fabrication of the IC structure 600, the positive ions 491 around the higher reference voltage 411 in the DNW 490 may be discharged through the transistor 682 of the dissipation device 580 and the electrical paths 581, 582 from the higher reference voltage 411 to the lower reference voltage 442 during the back-end plasma operations. Therefore, accumulation of the positive ions 491 during the back-end plasma operations may be prevented and damage to the gate 423 structure of the PMOS transistor 420 can be alleviated. Furthermore, the power clamp circuit may generally be formed in the IC structure 600, and thus no additional device needs to be added and the size of the IC structure 600 may be maintained or decreased.

Figure 5A:
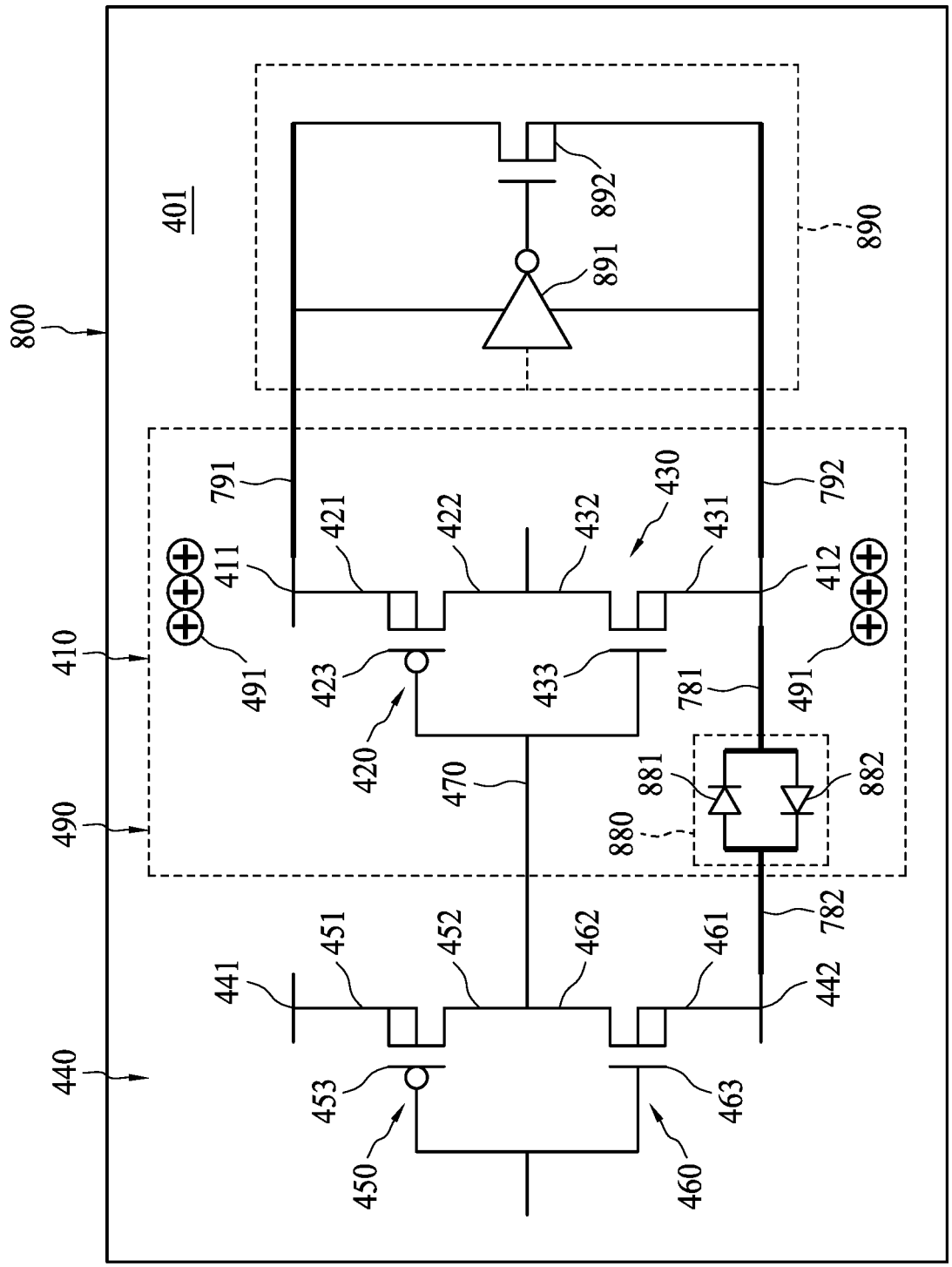
FIG. 5A is a circuit diagram of an IC structure, in accordance with some embodiments.
Figure 5B:
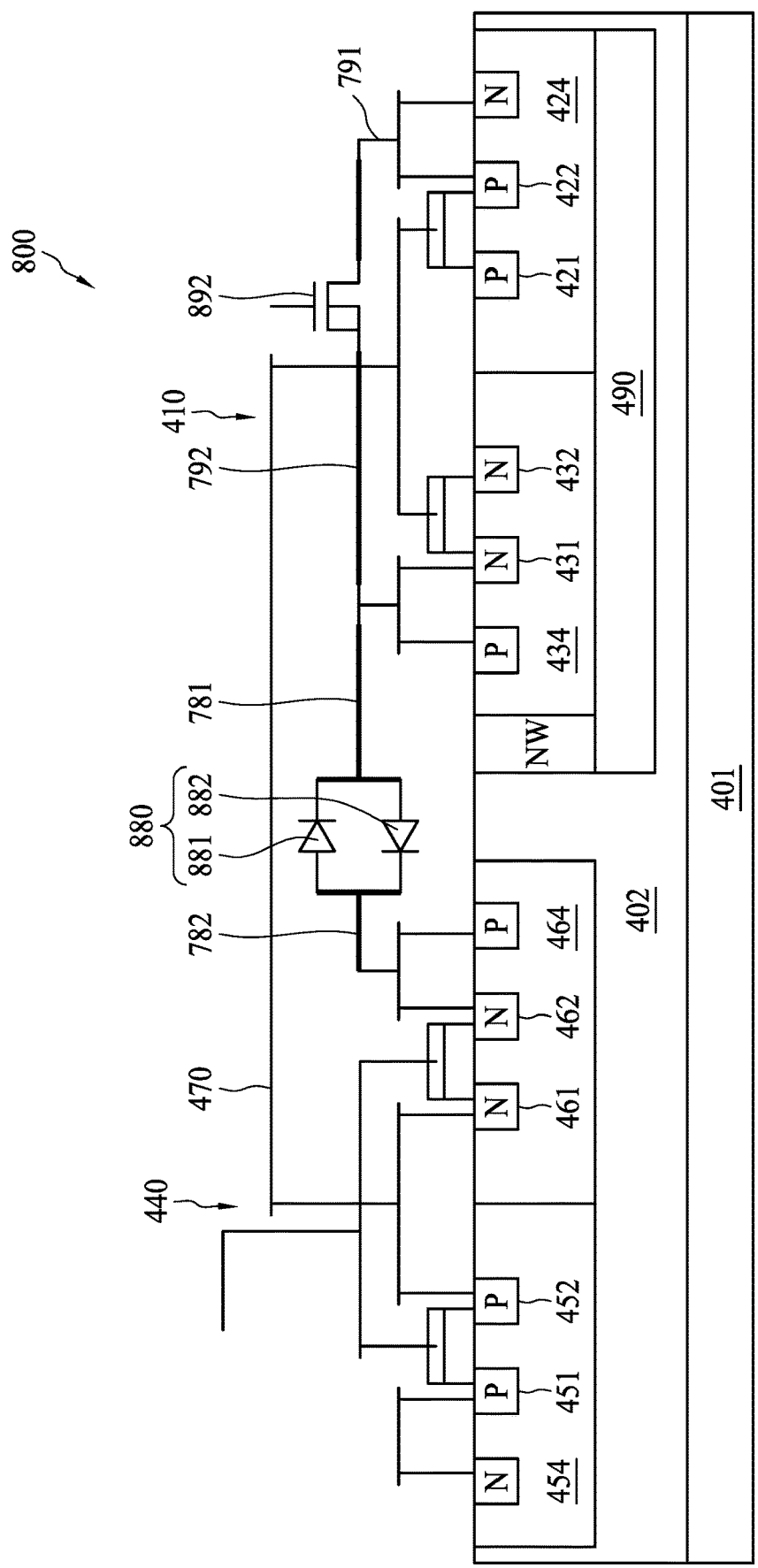
FIG. 5B is a cross-sectional view of a device portion of the IC structure, in accordance with some embodiments.

FIG. 5A is a circuit diagram of an IC structure 800, in accordance with some embodiments. FIG. 5B is a cross-sectional view of a device portion of the IC structure 800, in accordance with some embodiments. The difference between the IC structure 800 and the IC structure 600 in FIG. 4A and FIG. 4B is that the IC structure 800 includes a first dissipation device 880 and a second dissipation device 890. The first dissipation device 880 is connected to the lower reference voltage 412 through the electrical path 781 and connected to the lower reference voltage 442 through the electrical path 782. The second dissipation device 890 is connected to the higher reference voltage 411 through the electrical path 791 and connected to the lower reference voltage 412 through the electrical path 792. In some embodiments, the first dissipation device 880 and the second dissipation device 890 may include an ESD protection circuit respectively. The first dissipation device 880 may be a back-to-back diodes clamp as mentioned in FIG. 2A and FIG. 2B, and the second dissipation device 890 may be a power clamp circuit as mentioned in FIG. 4A and FIG. 4B. These are, of course, merely examples and are not intended to be limiting.

As in the embodiments shown in FIG. 1, FIG. 2A, FIG. 2B, FIG. 3, FIG. 4A and FIG. 4B, the electrical paths 781, 782, 791 and 792 may be formed at a same metal layer as the electrical path 470 or formed at a metal layer lower than the electrical path 470, and the detailed description is omitted herein for brevity.

In some embodiments, the positive ions 491 may accumulate around the higher reference voltage 411 and the lower reference voltage 412 in the DNW 490. During fabrication of the IC structure 700, the positive ions 491 around the higher reference voltage 411 in the DNW 490 may be discharged through the second dissipation device 790 and the electrical paths 791, 792 from the higher reference voltage 411 to the lower reference voltage 412, and the positive ions 491 around the lower reference voltage 412 may be further discharged through the first dissipation device 880 and the electrical paths 781, 782 from the lower reference voltage 412 to the lower reference voltage 442 during the back-end plasma operations. Accumulation of the positive ions 491 during the back-end plasma operations may be prevented and the damage to the first device 410 may be alleviated. Furthermore, the first dissipation device 880 and the second dissipation device 890 may be the devices that are generally formed in the IC structure 800 and no additional device needs to be added, and the size of the IC structure 800 may be maintained or decreased.

Figure 6:
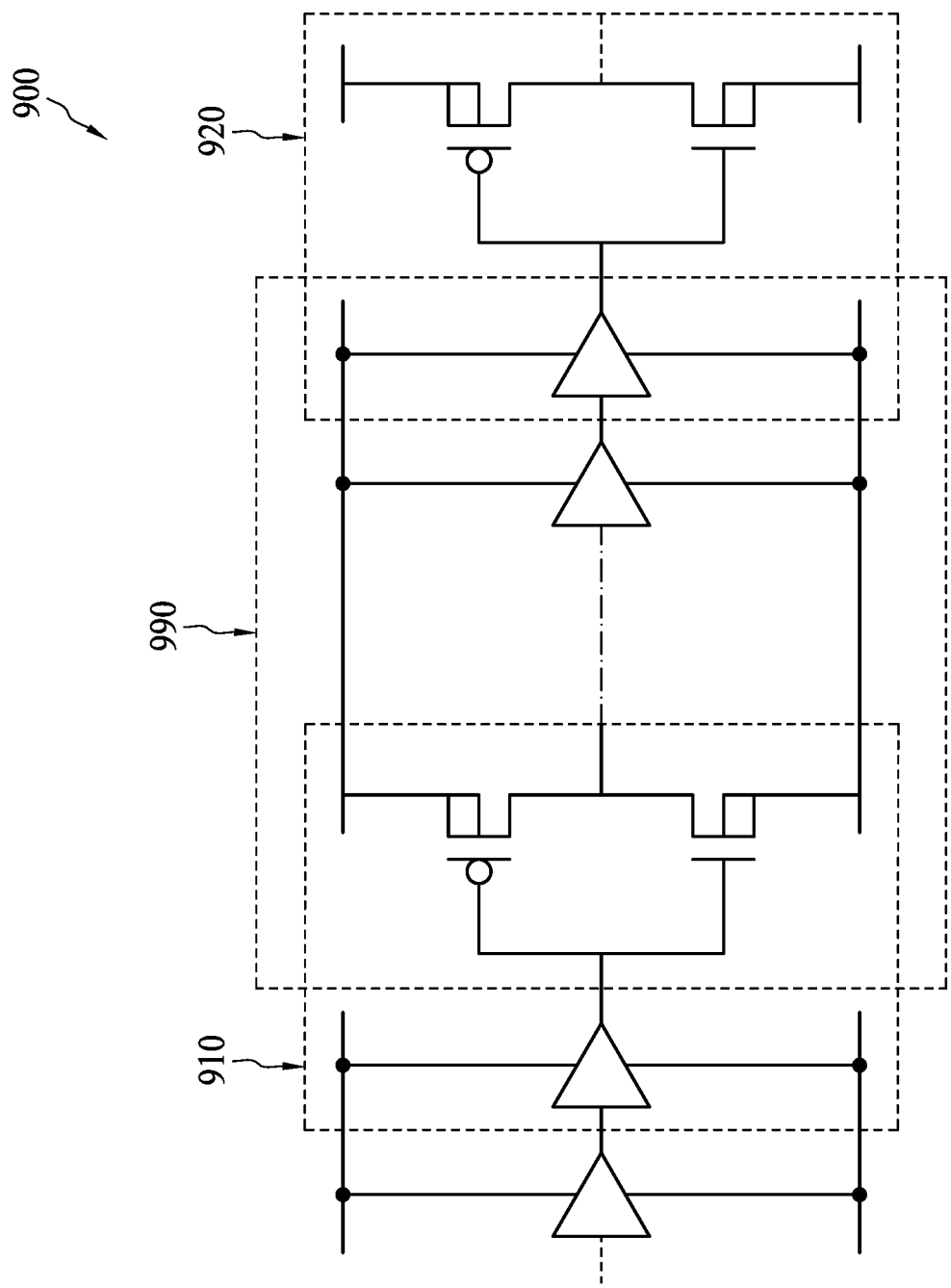
FIG. 6 is a circuit diagram of an IC structure, in accordance with some embodiments.

FIG. 6 is a circuit diagram of an IC structure 900, in accordance with some embodiments. Referring to FIG. 9, it is noted that FIG. 1, FIG. 2A, FIG. 2B, FIG. 3, FIG. 4A, FIG. 4B, FIG. 5A, and FIG. 5B illustrate examples of the structure of the signal-in portion 910 of the IC structure 900, but the positive ions accumulated in the DNW 990 may also damage the structure of the signal-out portion 920 of the IC structure 900. Therefore, the examples in FIG. 1, FIG. 2A, FIG. 2B, FIG. 3, FIG. 4A, FIG. 4B, FIG. 5A, and FIG. 5B may also be applied to the signal-out portion 920 of the IC structure 900, and detailed description is omitted herein for brevity.

In some embodiments according to the present disclosure, during the fabrication of the IC structure, the positive ions around the higher reference voltage and the lower reference voltage in the DNW may be discharged through the dissipation devices and several electrical paths to the lower reference voltage outside the DNW during the back-end plasma operations. Accumulation of the positive ions during the back-end plasma operations may be prevented and the damage to the device inside the DNW may be alleviated. Furthermore, the dissipation devices may be the devices that are generally formed in the IC structure and no additional device needs to be added, and the size of the IC structure may be maintained or decreased.

According to some embodiments, an integrated circuit (IC) structure is provided. The IC structure includes a substrate, a deep n-well (DNW), a first device, a second device, a first electrical path and a second electrical path. The DNW is in the substrate. The first device is formed inside the DNW and connected to a first lower reference voltage and a first higher reference voltage. The second device is formed in the substrate and outside the DNW, and is connected to a second lower reference voltage independent of the first lower reference voltage and a second higher reference voltage independent of the first higher reference voltage. The first electrical path is electrically connected between the first device and the second device. The second electrical path is electrically connected between the first lower reference voltage and the second lower reference voltage. A second metal layer which includes the second electrical path is located in a position outside of the area above a first metal layer in which the first electrical path is located.

According to other embodiments, an integrated circuit (IC) structure is provided. The IC structure includes a substrate, a deep n-well (DNW), a first NMOS transistor, a second NMOS transistor, a first dissipation device, a first electrical path and a second electrical path. The DNW is in the substrate. The first NMOS transistor is formed inside the DNW and is connected to a first lower reference voltage. The second NMOS transistor is formed in the substrate and outside the DNW, and is connected to a second lower reference voltage independent of the first lower reference voltage. The first dissipation device is formed in the substrate and is connected between the first device and the second lower reference voltage. The first electrical path is connected between the first NMOS transistor and the second NMOS transistor. The second electrical path is connected between the first lower reference voltage and the first dissipation device. A second metal layer which includes the second electrical path is located in a position outside of the area above a first metal layer in which the first electrical path is located.

According to other embodiments, an integrated circuit (IC) structure is provided. The IC structure includes a substrate, a deep n-well (DNW), a PMOS transistor, an NMOS transistor, a first dissipation device, a first electrical path and a second electrical path. The DNW is in the substrate. The PMOS transistor is formed inside the DNW and is connected to a first higher reference voltage. The NMOS transistor is formed in the substrate and outside the DNW, and is connected to a lower reference voltage. The first dissipation device is formed in the substrate and is connected to the first higher reference voltage and the lower reference voltage. The first electrical path is connected between the PMOS transistor and the NMOS transistor. The second electrical path is connected to the first dissipation device and the lower reference voltage. A second metal layer that includes the second electrical path is located in an area outside of the area above a first metal layer in which the first electrical path is located.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
   a substrate;
   a deep n-well (DNW) in the substrate;
   a first device inside the DNW and is connected to a first lower reference voltage and a first higher reference voltage;
   a second device in the substrate and outside the DNW, and is connected to a second lower reference voltage independent of the first lower reference voltage and a second higher reference voltage independent of the first higher reference voltage;
   a first electrical path electrically connected between the first device and the second device; and
   a second electrical path electrically connected between the first lower reference voltage and the second lower reference voltage,
   wherein a second metal layer that includes the second electrical path is located in an area outside the area above a first metal layer in which the first electrical path is located.

2. The IC structure of claim 1, further comprising:
   a first dissipation device in the substrate, wherein the first dissipation device is coupled between the first lower reference voltage and the second lower reference voltage through the second electrical path.

3. The IC structure of claim 2, wherein the first dissipation device comprises a first ESD protection circuit.

4. The IC structure of claim 3, wherein the first ESD protection circuit comprises a back-to-back diodes clamp.

5. The IC structure of claim 2, wherein the first device comprises an n-channel metal-oxide-semiconductor (NMOS) transistor connected to the first lower reference voltage and the first dissipation device.

6. The IC structure of claim 1, further comprising:
   a third electrical path electrically connected between the first higher reference voltage and the second lower reference voltage.

7. The IC structure of claim 6, further comprising:
   a second dissipation device in the substrate, wherein the second dissipation device is coupled between the first higher reference voltage and the first lower reference voltage through the third electrical path.

8. The IC structure of claim 7, wherein the second dissipation device comprises a second ESD protection circuit.

9. The IC structure of claim 8, wherein the second ESD protection circuit comprises a power clamp circuit.

10. The IC structure of claim 7, wherein the first device comprises a p-channel metal-oxide-semiconductor (PMOS) transistor electrically connected to the first higher reference voltage and the second dissipation device.

11. The IC structure of claim 6, wherein a third metal layer that includes the third electrical path is located in an area outside of an area above the first metal layer in which the first electrical path is located.

12. The IC structure of claim 1, wherein the first metal layer is not above an M3 level.

13. An integrated circuit (IC) structure, comprising:
    a substrate;
    a deep n-well (DNW) in the substrate;
    a first NMOS transistor inside the DNW and connected to a first lower reference voltage;
    a second NMOS transistor in the substrate and outside the DNW, and connected to a second lower reference voltage independent of the first lower reference voltage;
    a first dissipation device in the substrate and connected between the first lower reference voltage and the second lower reference voltage;
    a first electrical path connected between the first NMOS transistor and the second NMOS transistor; and
    a second electrical path connected between the first lower reference voltage and the first dissipation device,
    wherein a second metal layer that includes the second electrical path is located in an area outside of an area above a first metal layer in which the first electrical path is located.

14. The IC structure of claim 13, wherein the first dissipation device comprises an ESD protection circuit.

15. The IC structure of claim 14, wherein the ESD protection circuit comprises a back-to-back diodes circuit.

16. The IC structure of claim 13, further comprising a second dissipation device formed in the substrate, wherein the second dissipation device is connected to the second lower reference voltage.

17. An integrated circuit (IC) structure, comprising:
    a substrate;
    a deep n-well (DNW) in the substrate;
    a PMOS transistor inside the DNW and connected to a first higher reference voltage;
    an NMOS transistor in the substrate and outside the DNW, and connected to a lower reference voltage;
    a first dissipation device in the substrate and connected to the first higher reference voltage and the lower reference voltage;

a first electrical path connected between the PMOS transistor and the NMOS transistor; and a second electrical path connected between the first dissipation device and the lower reference voltage, wherein a second metal layer that includes the second electrical path is located in an area outside of an area above a first metal layer in which the first electrical path is located.

18. The IC structure of claim 17, wherein the first dissipation device comprises an ESD protection circuit.

19. The IC structure of claim 18, wherein the ESD protection circuit comprises a power clamp circuit.

20. The IC structure of claim 17, further comprising a second dissipation device formed in the substrate, wherein the second dissipation device is connected to the second lower reference voltage.

* * * * *